(12) United States Patent
Zhang et al.

(10) Patent No.: US 8,930,788 B2
(45) Date of Patent: Jan. 6, 2015

(54) LDPC DECODER WITH FRACTIONAL UNSATISFIED CHECK QUALITY METRIC

(75) Inventors: Fan Zhang, Milpitas, CA (US); Ming Jin, Fremont, CA (US); Wu Chang, Sunnyvale, CA (US); Haitao Xia, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 102 days.

(21) Appl. No.: 13/602,463

(22) Filed: Sep. 4, 2012

(65) Prior Publication Data

US 2014/0068368 A1    Mar. 6, 2014

(51) Int. Cl.
*H03M 13/00* (2006.01)

(52) U.S. Cl.
USPC ............................ 714/752; 714/758; 714/786

(58) Field of Classification Search
CPC ....................................................... G06F 11/10
USPC ............................ 714/752, 786, 758, 800, 801
See application file for complete search history.

(56) References Cited

U.S. PATENT DOCUMENTS

| | | | |
|---|---|---|---|
| 7,113,356 B1 | 9/2006 | Wu | |
| 7,814,402 B2* | 10/2010 | Gaudet et al. | 714/800 |
| 7,957,251 B2* | 6/2011 | Ratnakar Aravind et al. | 369/124.11 |
| 8,359,522 B2* | 1/2013 | Gunnam et al. | 714/758 |
| 2006/0256670 A1 | 11/2006 | Park | |
| 2011/0164669 A1 | 7/2011 | Mathew | |

OTHER PUBLICATIONS

U.S. Appl. No. 13/400,750, Unpublished (filed Feb. 21, 2012) (Fan Zhang).
U.S. Appl. No. 138433,742, Unpublished (filed Mar. 29, 2012) (Fan Zhang).
U.S. Appl. No. 13/316,953, Unpublished (filed Dec. 12, 2011) (Haitao Xia).
U.S. Appl. No. 13/561,230, Unpublished (filed Jul. 30, 2012) (Fan Zhang).
U.S. Appl. No. 13/340,974, Unpublished (filed Dec. 30, 2011) (Dan Liu).
U.S. Appl. No. 13/558,245, Unpublished (filed Jul. 25, 2012) (Fan Zhang).
U.S. Appl. No. 13/552,403, Unpublished (filed Jul. 18, 2012) (Fan Zhang).
U.S. Appl. No. 13/560,702, Unpublished (filed Jul. 27, 2012) (Fan Zhang).
U.S. Appl. No. 13/342,240, Unpublished (filed Jan. 3, 2012) (Shaohua Yang).
U.S. Appl. No. 13/445,848, Unpublished (filed Apr. 12, 2012) (Bruce Wilson).
U.S. Appl. No. 13/251,342, Unpublished (filed Oct. 3, 2011) (Haitao Xia).

* cited by examiner

*Primary Examiner* — Fritz Alphonse
(74) *Attorney, Agent, or Firm* — Hamilton DeSanctis & Cha

(57) ABSTRACT

An apparatus includes a low density parity check decoder operable to iteratively generate messages between a plurality of check nodes and variable nodes, and to calculate a fractional quality metric for a data block as it is decoded in the low density parity check decoder based at least in part on perceived values of data in the variable nodes. The fractional unsatisfied check quality metric is a probabilistic determination of a number of unsatisfied parity checks in the low density parity check decoder.

20 Claims, 6 Drawing Sheets

LDPC DECODER WITH FRACTIONAL UNSATISFIED CHECK QUALITY METRIC

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in Low Density Parity Check (LDPC) decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-124 and check nodes 102-108, with the values in the nodes 102-124 being adjusted based on the messages that are passed, until the values converge and stop changing or until processing is halted.

The number of unsatisfied parity checks calculated by an LDPC decoder may be used as a quality metric for a data block or sector for a number of purposes. However, the correlation between the number of unsatisfied parity checks for a data sector and the actual number of errors in the data sector is based upon assumptions that do not always hold true. Thus, the number of unsatisfied parity checks for a data sector is not always a good indicator of the actual number of errors in the data sector.

BRIEF SUMMARY

The present inventions are related to systems and methods for calculating data quality metrics for an LDPC decoder, and particularly for calculating a fractional unsatisfied check quality metric. In some embodiments, the fractional unsatisfied check quality metric is calculated in a probabilistic manner. A probability distribution is calculated giving the probability of each possible number of unsatisfied checks for a data sector (or codeword) as it is decoded in an LDPC decoder. In some embodiments, a mean value for the unsatisfied check probability distribution is calculated as a fractional unsatisfied check quality metric. In other embodiments, other algorithms than the mean are used to derive the fractional unsatisfied check quality metric from the unsatisfied check probability distribution. Such a fractional unsatisfied check quality metric provides better correlation with actual errors in the data sector than a count of the unsatisfied parity checks during decoding of the data sector.

In some embodiments, the fractional unsatisfied check quality metric is calculated by first calculating the probability that a parity check will be unsatisfied for each check node, then by calculating the unsatisfied check probability distribution including the probability for each possible number k of unsatisfied checks that the data sector has k unsatisfied checks, and finally by calculating the fractional unsatisfied check quality metric based on the unsatisfied check probability distribution.

One or more features of the LDPC decoder may make use of the fractional unsatisfied check quality metric, such as a scheduler or an error recovery circuit. For example, the scheduler may determine which of a number of data sectors receives priority in the LDPC decoder in order to focus decoding resources on higher quality data sectors first. An error recovery circuit may select among several available error recovery algorithms such as targeted symbol flipping, bit selective scaling, trapping set elimination features, etc. based on the fractional unsatisfied check quality metric, for example invoking a more aggressive error recovery algorithm for lower quality data sectors.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
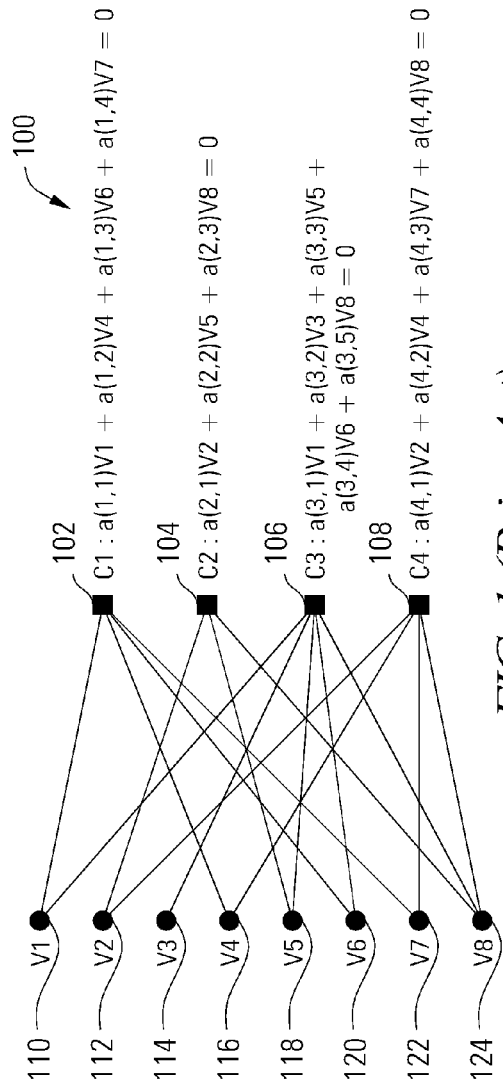
FIG. 1 depicts a Tanner graph of an example prior art LDPC code.

The present inventions are related to systems and methods for calculating data quality metrics for an LDPC decoder, and particularly for calculating a fractional unsatisfied check quality metric. The LDPC decoder used in various embodiments may be any type of LDPC decoder, including binary and non-binary, layered and non-layered. LDPC technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Quality metrics in an LDPC decoder are calculated as a quality indicator of the LLR values that represent the probability that a variable node contains a particular value. Such quality metrics may be used in an LDPC decoder and in data processing systems incorporating an LDPC decoder for many purposes, such as a scheduler or an error recovery circuit. For example, the scheduler may determine which of a number of data sectors receives priority in the LDPC decoder in order to focus decoding resources on higher quality data sectors first, referred to herein as quality sorting scheduling. Knowing the current error rate of each sector in the queuing system enables the LDPC decoder to allocate resources efficiently, improving performance and reducing power consumption. An error recovery circuit may select among several available error recovery algorithms such as targeted symbol flipping, bit selective scaling, trapping set elimination features, etc. based on the fractional unsatisfied check quality metric, for example invoking a more aggressive error recovery algorithm for lower quality data sectors. Other applications of a quality metric include the control of bit selective scaling, short media defect detection, and trapping set elimination features.

The fractional unsatisfied check quality metric disclosed herein is a probabilistic determination of the number of unsatisfied parity checks in a decoding iteration for a codeword. An unsatisfied parity check (or USC) is defined herein as the number of parity check equations which are not satisfied during the decoding process. Parity check calculations are performed in check nodes based on the incoming messages from connected variable nodes, referred to as variable node to check node messages or V2C messages. The number of unsatisfied parity checks has been used as a quality metric to represent the actual number of errors in the codeword, which cannot be directly measured. However, the correlation between the number of unsatisfied parity checks for a data sector codeword and the actual number of errors in the codeword is based upon assumptions that do not always hold true. For example, correlation between the number of unsatisfied parity checks for a data sector codeword and the actual number of errors in the codeword may be based on the assumption that errors are randomly distributed among all the bits or symbols of a data sector. An interleaver may be included in a data processing system in an attempt to randomize the distribution of errors in the data sector. However, errors may still be clustered in the input to the LDPC decoder. Thus, the number of unsatisfied parity checks for a data sector is not always a good indicator of the actual number of errors in the data sector.

Figure 2:
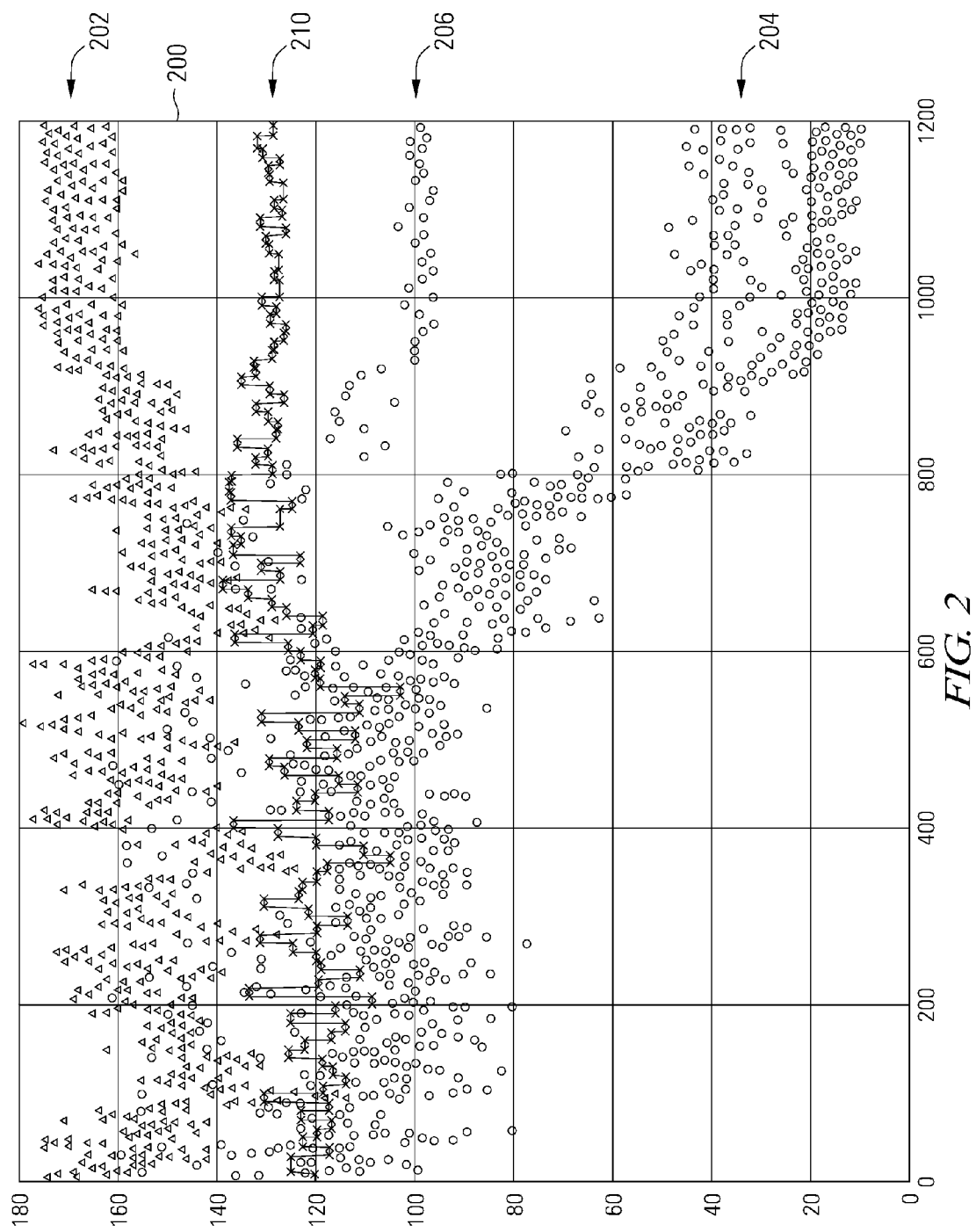
FIG. 2 is a data plot of the number of errors in a test data sector as it is processed in an LDPC decoder simulation, the number of unsatisfied parity checks for the data sector, and a fractional unsatisfied parity check quality metric for the data sector in accordance with some embodiments of the present inventions.

Turning to FIG. 2, the disparity that can occur between the number of unsatisfied parity checks and the number of errors in a data sector is shown in data plot 200, with the decoding iteration number on the X-axis and the error count on the Y-axis. Data plot 200 includes a scatter plot 202 of the number of errors in the variable node values for a test data sector as it is processed in an LDPC decoder simulation. The error counts in the variable node values are represented on data plot 200 as triangles. (The error counts for many of the iterations have been omitted for clarity, in order to avoid clutter on data plot 200 due to overlapping data markers, while still showing the trend.)

Again, the error count is a quantity that cannot be directly measured in an LDPC decoder. Data plot 200 is obtained using an LDPC decoder simulation to decode a codeword for a data sector that has been designed with errors so that it will not converge in the LDPC decoder, or by simulating an LDPC decoder with a trapping set to prevent convergence, in order to display the relationship between the errors and the number of unsatisfied parity checks. In this way, the variable node values generated by the LDPC decoder can be compared in each iteration with the true values to obtain the error count.

The data plot 200 also includes a scatter plot 204 of the number of check nodes with unsatisfied parity checks for the test data sector, indicated with circles. (A group 206 of unsatisfied check counts is shown above the majority of the unsatisfied check scatter plot 204, because in the simulated LDPC decoder, the number of unsatisfied parity checks is generally higher during the first local iteration of each global iteration.) Notably, the number of check nodes with unsatisfied parity checks shown in scatter plot 204 diverges from the number of errors in the variable node values shown in scatter plot 202 after about 700 iterations. Although the number of errors in the variable node values remains in about the range between 140 and 180 errors up through 1200 iterations, the number of unsatisfied parity checks drops to within a range between about 10 and 50 from the original range of about 80 to 160 unsatisfied parity checks. This divergence is particularly likely to occur in low error rate regimes. If the number of unsatisfied parity checks were used as a quality metric in this example, this divergence would cause undesired behaviors. For example, if a scheduler in the LDPC decoder used the number of unsatisfied parity checks for sorting of data sectors, it might determine that this data sector was expected to converge and give it priority processing over other data sectors, when in fact this data sector would not converge.

The data plot 200 also shows a scatter plot and line graph 210 of the fractional unsatisfied parity check quality metric calculated as disclosed herein, depicted as x's on a line graph. Notably, the fractional unsatisfied parity check quality metric (210) tracks the number of errors in the variable node values (202) much more closely than the number of unsatisfied parity checks (204) does. The fractional unsatisfied parity check quality metric is a probabilistically calculated expectation of the number of unsatisfied parity checks for a data sector codeword, calculated for every iteration or at other intervals. It is a fractional number, calculated based on LLR values or perceived values of variable nodes in the H matrix of the LDPC decoder. In some embodiments, the LLR values are taken from V2C messages from variable nodes to check nodes, although they may also be taken from the decoder input or the input memory, for example.

The probability p1 of each parity check in the H matrix to be unsatisfied, or USC/SC, is calculated, where USC refers to being an unsatisfied check and SC refers to being a satisfied check. The calculation of p1 disclosed herein is based on LLR values bounded between lmin and lmax, with the LLR defined (for an example binary decoder) as log(p0/p1), or the log of the probability of a bit being 0 over the probability of the bit being 1. For a given check node, CN, the most ambiguous connected variable node VN is identified. The most ambiguous VN is defined as:

$$\text{argmin}\_i[\min\_j(\text{llr}\_\{i,j\})] \quad \text{(Eq 1)}$$

where i is the variable node index and j is the LLR index of the non-zero LLR's for the variable node. In other words, the most ambiguous VN is the one which has the largest non-zero LLR component among all the connected variable nodes.

The probability p1 that the parity check for the current check node CN will be unsatisfied is then calculated based on the LLR value for the identified VN as follows:

$$p1 = 1 - \frac{(LLR + (LLR > 0 ? 1:1) * lmax}{lmax - lmin} \quad \text{(Eq 2)}$$

For example, given LLR=−2, lmin=−30 and lmax=30, p1=1−(−2+30)/60=0.53

In a non-binary LDPC decoder, the probability p1 of each parity check in the H matrix to be an unsatisfied check (USC) may also be calculated based on the LLR values of the variable nodes attached to the check node. Given a GF(4) LDPC decoder, where the symbol LLR is $[l_0, l_1, l_2, l_3]$ and with check node degree $d_c$, the probability that a check node will unsatisfied is equal to 1 minus the probability that the check node will be satisfied:

$$Pr(\text{a CN is USC}|\text{LLR's on this CN})=1-Pr(\text{a CN is SC}|\text{LLR's on this CN}) \quad \text{(Eq 3)}$$

If the syndrome s is 0, the probability that a check is satisfied may be calculated as:

$$Pr(\text{a } CN \text{ is } SC | LLR\text{'s on this } CN \text{ and } s = 0) = \exp\left(-\frac{\sum_{j=0}^{d_c} \sum_{i=0; i \neq hd}^{3} |L_{max} - l_i|}{3|L_{max}|d_c}\right) \quad \text{(Eq 4)}$$

If the syndrome is $s_0 \neq 0$, the probability that a check is satisfied may be calculated as:

$$Pr(\text{a CN is SC} | LLR\text{'s on this CN and } s = s_0) \approx \exp\left(-\frac{\sum_{i=0}^{d_c-1} |l_{v_i} - l_{v_{i,j}}|}{|L_{max}|d_c}\right) \quad (\text{Eq 5})$$

where $v_i$ is the hard decision of the i-th variable node, and $v_{i,j}$ is defined as the value such that $(v_{i,j} - v_i)e_i = s_0$. The physical meaning of $v_{i,j}$ is that, when changing the i-th symbol from $v_i$ (current value) to a new value, which is $v_{i,j}$, the contribution to the syndrome is $s_0$ so that the new syndrome is 0. For example, assume a check node with two variable nodes connected to it, and the symbol LLR's for the two variable nodes are [−8,−12,0,−30] and [−8,−12,−10,0], with hard decisions 2 and 3 and edge weights 1 and 3. The syndrome is 2*3+3*3=0 (using finite field arithmetic). The fractional unsatisfied check quality metric would be calculated as:

$$\frac{|(-30)-(-8)| + |(-30)-(-12)| + |(-30)-(-30)|}{3*30*2} \quad (\text{Eq 6})$$

Given the probability p1, calculated as disclosed above for each check node, of the check node to be an unsatisfied check given the LLR's of the connected variable nodes, a probability distribution is calculated for p2(k), the probability for each possible number k of unsatisfied checks that there are k unsatisfied parity checks for the data sector codeword during a decoding iteration.

The precise calculation of p2(k) is a straightforward combinatorial problem that may be solved by calculating the k-th coefficient of the characteristic polynomial giving the total number of possible combinations such that there are k unsatisfied parity checks. However, in some embodiments p2(k) is calculated in a simplified manner using a first-order approximation of the precise calculation. Again, k ranges across the possible number of unsatisfied parity checks for the H matrix. For each possible value of k, p2(k) is calculated by identifying the k+1 check nodes with the largest p1 values, and calculating p2(k) based on those k+1 p1 values as follows:

$$p_2(k) = \sum_{i=1}^{k+1} (1 - p_1(i)) \prod_{j \neq i} p_1(j) \quad (\text{Eq 7})$$

where $(1-p_1(i))$ is the probability that the parity check equation for check node i is satisfied, multiplied by the product of the probabilities that the parity check equations for all other check nodes are unsatisfied, with the resulting quantities summed over the k+1 p1 values. In this way, all of the k+1 different ways of choosing k p1 values from the k+1 p1 are considered. The term being summed over is the probability of each combination's occurrence, with one term k, or check, satisfied, and the rest unsatisfied. Only the largest k+1 p1 values are considered when calculating p2(k), because the value for a particular k is dominated by the largest k+1 terms.

Given the calculated probability distribution p2(k), the fractional unsatisfied check quality metric may be calculated, for example, by taking the mean of the probability distribution p2(k). The result is a fractional number, probabilistically calculated to represent the number of unsatisfied parity checks. The fractional unsatisfied check quality metric provides better correlation with actual bit or symbol errors during LDPC decoding, particularly in a low error rate regime.

Figure 3:
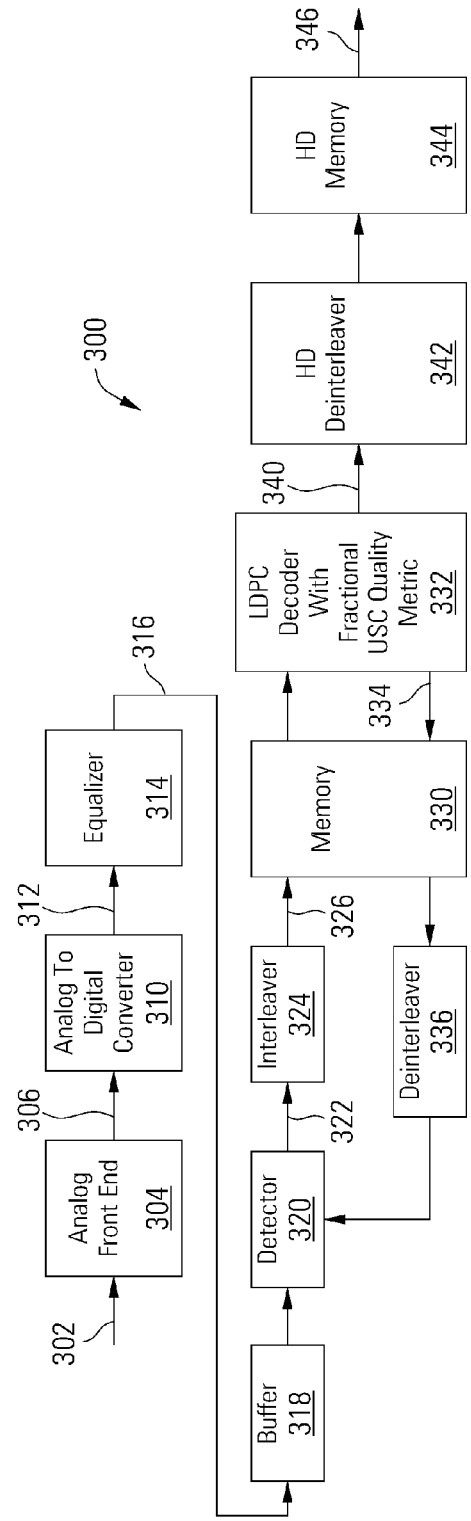
FIG. 3 depicts a read channel for a hard disk drive, incorporating an LDPC decoder calculating a fractional unsatisfied check quality metric in accordance with some embodiments of the present inventions.

Turning to FIG. 3, a read channel 300 is depicted that includes an LDPC decoder with fractional unsatisfied check quality metric 332 in accordance with some embodiments of the present inventions. The read channel 300 processes an analog signal 302 to retrieve user data bits from the analog signal 302 without errors. In some cases, analog signal 302 is derived from a read/write head assembly in a magnetic storage medium. In other cases, analog signal 302 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 302 may be derived.

The read channel 300 includes an analog front end 304 that receives and processes the analog signal 302. Analog front end 304 may include, but is not limited to, an analog filter and an amplifier circuit as are known in the art. Based upon the disclosure provided herein, one of ordinary skill in the art will recognize a variety of circuitry that may be included as part of analog front end 304. In some cases, the gain of a variable gain amplifier included as part of analog front end 304 may be modifiable, and the cutoff frequency and boost of an analog filter included in analog front end 304 may be modifiable. Analog front end 304 receives and processes the analog signal 302, and provides a processed analog signal 306 to an analog to digital converter 310.

Analog to digital converter 310 converts processed analog signal 306 into a corresponding series of digital samples 312. Analog to digital converter 310 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 312 are provided to an equalizer 314. Equalizer 314 applies an equalization algorithm to digital samples 312 to yield an equalized output 316. In some embodiments of the present invention, equalizer 314 is a digital finite impulse response filter circuit as is known in the art. Data or codewords contained in equalized output 316 may be stored in a buffer 318 until a data detector 320 is available for processing.

The data detector 320 performs a data detection process on the received input, resulting in a detected output 322. In some embodiments of the present invention, data detector 320 is a Viterbi algorithm data detector circuit, or more particularly in some cases, a maximum a posteriori (MAP) data detector circuit as is known in the art. In these embodiments, the detected output 322 contains log-likelihood-ratio (LLR) information about the likelihood that each bit or symbol has a particular value. Based upon the disclosure provided herein, one of ordinary skill in the art will recognize a variety of data detectors that may be used in relation to different embodiments of the present invention. Data detector 320 is started based upon availability of a data set in buffer 318 from equalizer 314 or another source.

The detected output 322 from data detector 320 is provided to an interleaver 324 that protects data against burst errors. Burst errors overwrite localized groups or bunches of bits. Because LDPC decoders are best suited to correcting errors that are more uniformly distributed, burst errors can overwhelm LDPC decoders. The interleaver 324 prevents this by interleaving or shuffling the detected output 322 from data detector 320 to yield an interleaved output 326 which is stored in a memory 330. The interleaved output 326 from the memory 330 is provided to a multi-level LDPC layer decoder 332 which performs parity checks on the interleaved output 326, ensuring that parity constraints established by an LDPC encoder (not shown) before storage or transmission are satisfied in order to detect and correct any errors that may have occurred in the data during storage or transmission or during processing by other components of the read channel 300.

Multiple detection and decoding iterations may be performed in the read channel 300, both global iterations through the detector 320 and LDPC decoder 332 and local iterations within the LDPC decoder 332. To perform a global iteration, LLR values 334 from the LDPC decoder 332 are stored in memory 330, deinterleaved in a deinterleaver 336 to reverse the process applied by interleaver 324, and provided again to the data detector 320 to allow the data detector 320 to repeat the data detection process, aided by the LLR values 334 from the LDPC decoder 332. In this manner, the read channel 300 can perform multiple global iterations, allowing the data detector 320 and LDPC decoder 332 to converge on the correct data values.

During the course of decoding a data sector or codeword in the LDPC decoder 332, a fractional unsatisfied check quality measurement or metric is calculated in the LDPC decoder 332 based at least in part on LLR values as disclosed above. One or more features of the LDPC decoder may make use of the fractional unsatisfied check quality metric, such as a scheduler or an error recovery circuit. For example, the scheduler may determine which of a number of data sectors receives priority in the LDPC decoder in order to focus decoding resources on higher quality data sectors first. An error recovery circuit may select among several available error recovery algorithms such as targeted symbol flipping, bit selective scaling, trapping set elimination features, etc. based on the fractional unsatisfied check quality metric, for example invoking a more aggressive error recovery algorithm for lower quality data sectors.

The LDPC decoder 332 also produces hard decisions 340 about the values of the data bits or symbols contained in the interleaved output 326 of the interleaver 324. For binary data bits, the hard decisions may be represented as 0's and 1's. In a GF(4) LDPC decoder, the hard decisions may be represented by four field elements 00, 01, 10 and 11.

The hard decisions 340 from LDPC decoder 332 are deinterleaved in a hard decision deinterleaver 342, reversing the process applied in interleaver 324, and stored in a hard decision memory 344 before being provided to a user or further processed. For example, the output 346 of the read channel 300 may be further processed to reverse formatting changes applied before storing data in a magnetic storage medium or transmitting the data across a transmission channel.

Figure 4:
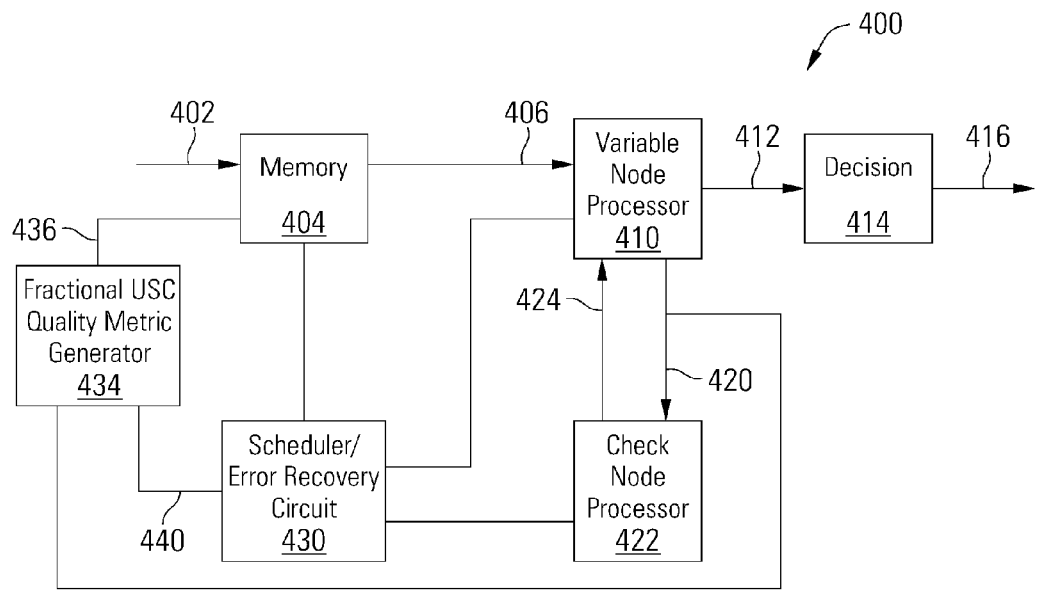
FIG. 4 depicts a block diagram of an LDPC decoder with a fractional unsatisfied check quality metric generator in accordance with some embodiments of the present inventions.

Turning to FIG. 4, a block diagram of an LDPC decoder with fractional unsatisfied check quality metric 400 is depicted in accordance with some embodiments of the present inventions. The LDPC decoder with fractional unsatisfied check quality metric 400 may be a binary or multi-level decoder, layered or non-layered, and is not limited to any particular algorithm for parity check calculations or message generation techniques. Input data 402 is stored in a memory 404. Input data 402 includes LLR values in some embodiments. LLR values 406 from memory 404 are provided to a variable node processor 410, which generates V2C messages 420 containing LLR values for the perceived value of each bit or symbol. A check node processor 422 receives the V2C messages 420 and performs parity check calculations for each check node based on messages from connected variable nodes. The check node processor 422 also generates C2V messages 424, enabling the variable node processor 410 to update the perceived value for each variable node based on C2V messages 424 from connected check nodes. Updated variable node values may also be updated in the memory 404 during local decoding iterations, either by the variable node processor 410 or check node processor 422 or both. LLR values 412 from the variable node processor 410 may also be provided to a decision circuit 414 which generates a hard decision output 416.

A fractional unsatisfied check quality metric generator 434 in the LDPC decoder 400 calculates a fractional unsatisfied check quality metric 440 or metric at each decoding iteration, either global or local or both, for a data sector codeword being decoded. The fractional unsatisfied check quality metric is calculated based on LLR values such as those in V2C messages 420, or in LLR values 436 retrieved from the memory 404 or in the input data 402. In some embodiments, the fractional unsatisfied check quality metric generator 434 calculates the fractional unsatisfied check quality metric by first calculating the probability that a parity check will be unsatisfied for each check node, then by calculating the unsatisfied check probability distribution including the probability for each possible number k of unsatisfied checks that the data sector has k unsatisfied checks, and finally by calculating the fractional unsatisfied check quality metric based on the unsatisfied check probability distribution.

One or more features of the LDPC decoder 400 may make use of the fractional unsatisfied check quality metric 440, such as a scheduler or an error recovery circuit 430. For example, the scheduler may determine which of a number of data sectors receives priority in the LDPC decoder in order to focus decoding resources on higher quality data sectors first. An error recovery circuit may select among several available error recovery algorithms such as targeted symbol flipping, bit selective scaling, trapping set elimination features, etc. based on the fractional unsatisfied check quality metric, for example invoking a more aggressive error recovery algorithm for lower quality data sectors.

Figure 5:
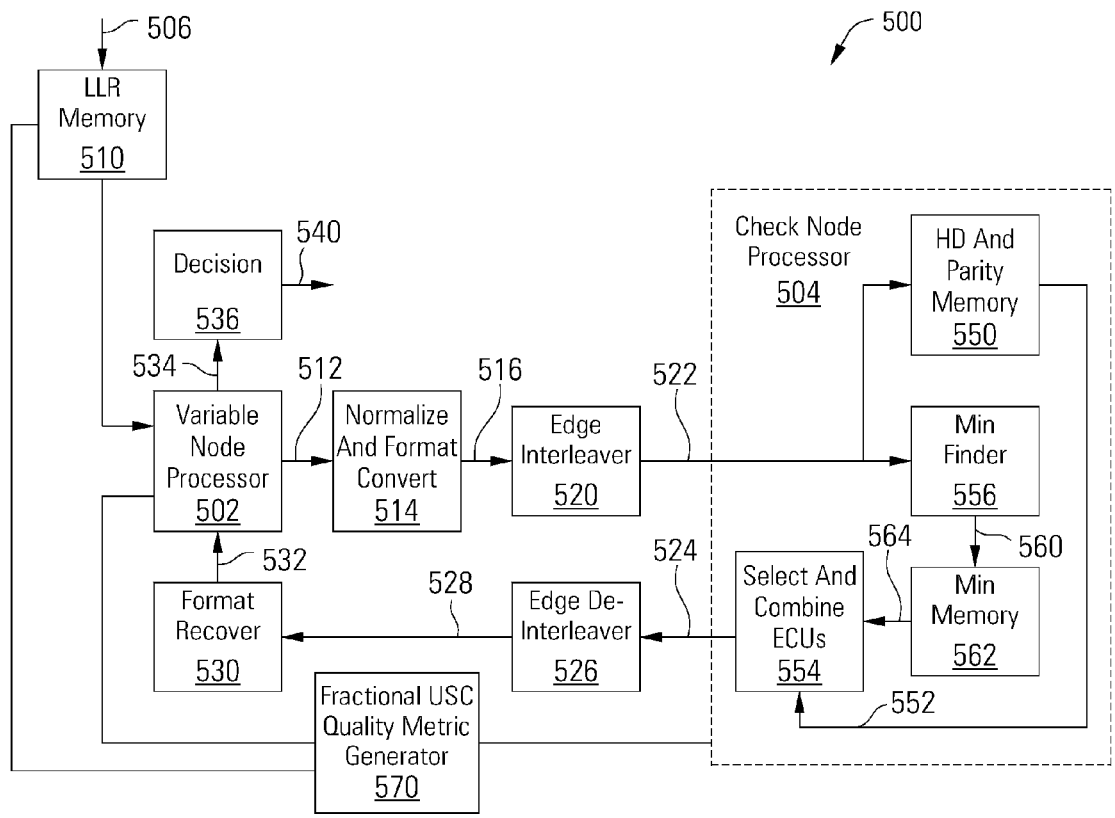
FIG. 5 depicts a block diagram of a multi-level min-sum based LDPC decoder with a fractional unsatisfied check quality metric generator in accordance with some embodiments of the present inventions.

Turning to FIG. 5, in some embodiments, the LDPC decoder with fractional unsatisfied check quality metric is a min-sum based LDPC decoder 500 in which check nodes calculate a minimum, next minimum and hard decision value based on incoming V2C or variable node message vectors. However, it is important to note that the LDPC decoder with fractional unsatisfied check quality metric is not limited to the min-sum based non-binary LDPC decoder 500 of FIG. 5, but that any suitable LDPC decoder may be operable to implement the fractional unsatisfied check quality metric disclosed herein.

The min-sum based non-binary LDPC decoder 500 is provided with an input 506, for example containing a hard decision and corresponding LLR values, which are stored in a symbol memory 510. The input 506 is provided to the variable node processor 502 from the symbol memory 510, and the variable node processor 502 updates the perceived value of each symbol based on the value from input 506 and on C2V message vectors or check node messages from a check node processor 504. The variable node processor 502 also generates V2C message vectors 512 or variable node messages for neighboring check nodes.

Check nodes (implemented in check node processor 504) in a min-sum based non-binary LDPC decoder receive incoming messages from connected or neighboring variable nodes (implemented in variable node processor 502) and generate outgoing messages to each neighboring variable node to implement the parity check matrix for the LDPC code, an example of which is graphically illustrated in the Tanner graph of FIG. 1. Incoming messages to check nodes are also referred to herein as V2C messages, indicating that they flow from variable nodes to check nodes, and outgoing messages from check nodes are also referred to herein as C2V messages, indicating that they flow from check nodes to variable nodes. The check node uses multiple V2C messages to generate an individualized C2V message with for each neighboring variable node.

In various embodiments of LDPC decoders that may be adapted to generate and use a fractional unsatisfied check quality metric, the variable node processor 502 and check node processor 504 may each be unitary, discrete components, or their functions may be distributed and intermixed in multiple components. The terms variable node processor and check node processor are therefore not limited to two discrete processing components, but apply generally to any components or combinations of components in an LDPC decoder that update variable node values and generate variable node to check node messages for variable node processing, and that perform check node constraint calculations and generate check node to variable node messages for check node processing.

Both V2C and C2V messages in this embodiment are vectors, each including a number of sub-messages with LLR values. Each V2C message vector from a particular variable node contains sub-messages corresponding to each symbol in the Galois Field, with each sub-message giving the likelihood that the variable node contains that particular symbol. For example, given a Galois Field GF(q) with q elements, V2C and C2V messages will include at least q sub-messages representing the likelihood for each symbol in the field.

Generally, the C2V vector message from a check node to a variable node contains the probabilities for each symbol d in the Galois Field that the destination variable node contains that symbol d, based on the prior round V2C messages from neighboring variable nodes other than the destination variable node. The inputs from neighboring variable nodes used in a check node to generate the C2V message for a particular neighboring variable node are referred to as extrinsic inputs and include the prior round V2C messages from all neighboring variable nodes except the particular neighboring variable node for which the C2V message is being prepared, in order to avoid positive feedback. The check node thus prepares a different C2V message for each neighboring variable node, using the different set of extrinsic inputs for each message based on the destination variable node.

In the min-sum based decoding disclosed herein, the check nodes calculate the minimum sub-message $min_1(d)$, the index idx(d) of $min_1(d)$, and the sub-minimum sub-message $min_2(d)$, or minimum of all sub-messages excluding $min_1(d)$, for each nonzero symbol d in the Galois Field based on all extrinsic V2C messages from neighboring variable nodes. In other words, the sub-messages for a particular symbol d are gathered from messages from all extrinsic inputs, and the $min_1(d)$, idx(d) and $min_2(d)$ is calculated based on the gathered sub-messages for that symbol d. For a Galois Field with q symbols, the check node will calculate the $min_1(d)$, idx(d) and $min_2(d)$ sub-message for each of the q−1 non-zero symbols in the field except the most likely symbol.

The V2C message vectors 512 from the variable node processor 502 are provided to a message format converter 514 which converts the format of V2C message vectors 512 to a format consisting of two parts, the most likely symbol, and the LLR of other symbols, normalized to the most likely symbol, yielding normalized V2C message vectors 516 in the second format. Message normalization in the message format converter 514 is performed with respect to the most likely symbol. Thus, the V2C and C2V vector format includes two parts, an identification of the most likely symbol and the LLR for the other q−1 symbols, since the most likely symbol has LLR equal to 0 after normalization. The normalized V2C message vectors 516 are provided to an edge interleaver 520 which shuffles messages on the boundaries at message edges, randomizing noise and breaking dependencies between messages. The interleaved normalized V2C message vectors 522 are provided to the check node processor 504, which generates C2V messages 524 for each neighboring variable node processor based on extrinsic V2C messages from other neighboring variable node processors.

The C2V messages 524 are provided to an edge de-interleaver 526, which reverses the process of the edge interleaver 520, and then to a format recovery circuit 530, which converts message vectors from the second, normalized format to the first message vector format of the variable node processor 502, reversing the process of the message format converter 514. The resulting first format C2V messages 532 are provided to the variable node processor 502 for use in updating perceived LLR values in variable nodes. In other embodiments, the variable node processor 502 is adapted to operate directly with message vectors of the second, normalized format. In these embodiments, the message format converter 514 and format recovery circuit 530 are omitted.

When the values in the min-sum based non-binary LDPC decoder 500 converge and stabilize, or when a limit is reached on the number of local iterations, the variable node processor 502 provides the total LLR $S_n(a)$ 534 to a decision circuit 536 to generate a hard decision 540 based on the $argmin_a$ of the total LLR $S_n(a)$.

The check node processor 504 includes a hard decision and parity memory circuit 550 that processes the interleaved normalized V2C message vectors 522 to provide the most likely symbol 552 to a select and combine circuit 554 having a number of elementary computation units (ECUs). The check node processor 504 also includes a min finder 556 that calculates the $min_1(d)$, idx(d) and $min_2(d)$ sub-messages 560 for each of the q symbols in the Galois Field and stores them in a min memory 562. The stored $min_1(d)$, idx(d) and $min_2(d)$ sub-messages 564 are provided by min memory 562 to the select and combine circuit 554. The select and combine circuit 554 combines the $min_1(d)$, idx(d) and $min_2(d)$ sub-messages 564 and the most likely symbol 552 to generate the C2V messages 524.

The message vector format conversion performed by message format converter 514 on V2C message vectors 512 is reversed by format recovery circuit 530, providing C2V messages 532 to variable node processor 502 in the format used by the variable node processor 502.

A fractional unsatisfied check quality metric generator 570 in the min-sum based non-binary LDPC decoder 500 calculates the fractional unsatisfied check quality metric by first calculating the probability that a parity check will be unsatisfied for each check node, then by calculating the unsatisfied check probability distribution including the probability for each possible number k of unsatisfied checks that the data sector has k unsatisfied checks, and finally by calculating the fractional unsatisfied check quality metric based on the unsatisfied check probability distribution.

Again, one or more features of the LDPC decoder 500 may make use of the fractional unsatisfied check quality metric calculated by the fractional unsatisfied check quality metric generator 570, such as a scheduler or an error recovery circuit (not shown). For example, the scheduler may determine which of a number of data sectors receives priority in the LDPC decoder in order to focus decoding resources on higher quality data sectors first. An error recovery circuit may select among several available error recovery algorithms such as targeted symbol flipping, bit selective scaling, trapping set elimination features, etc. based on the fractional unsatisfied check quality metric, for example invoking a more aggressive error recovery algorithm for lower quality data sectors.

Figure 6:
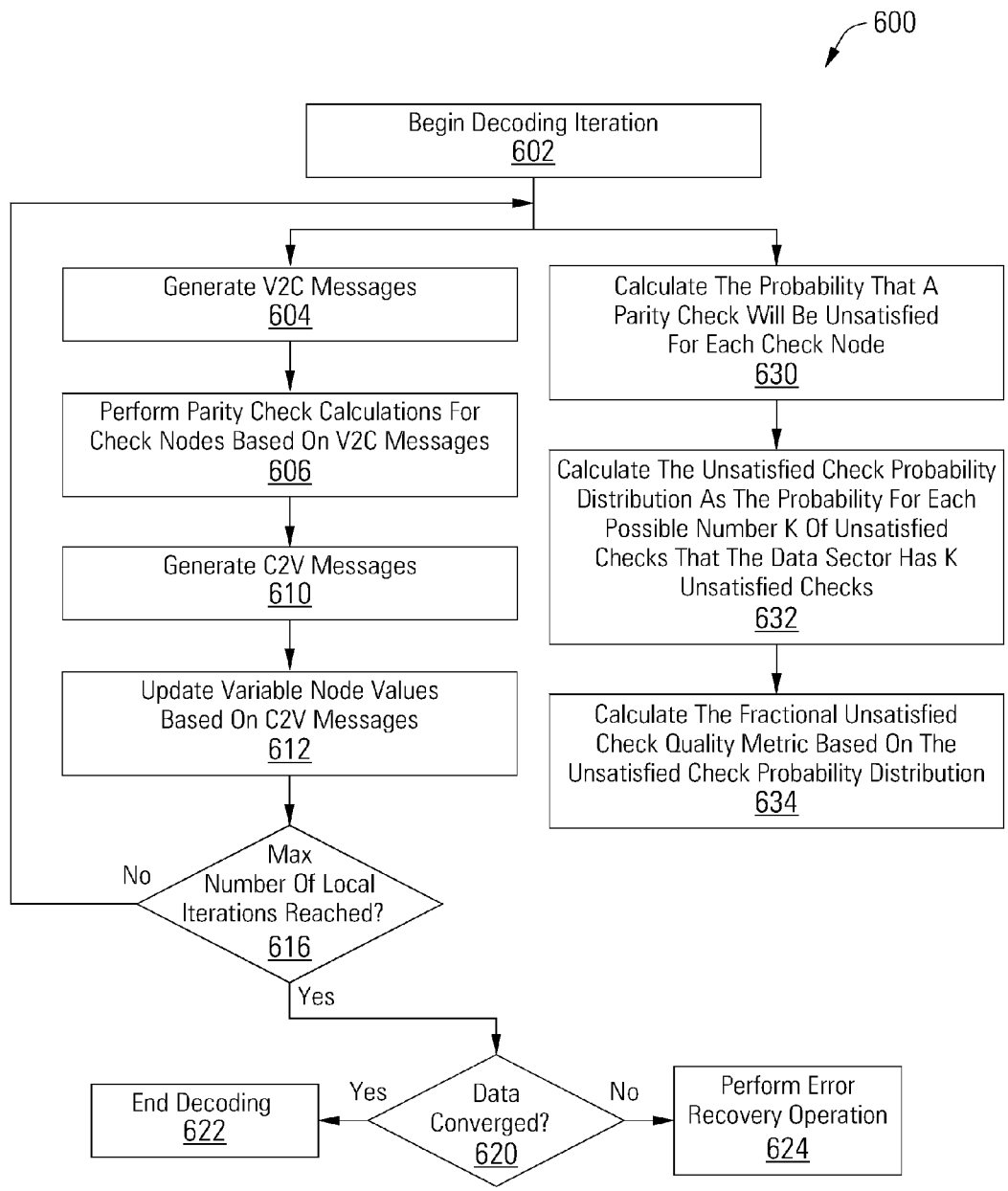
FIG. 6 depicts a flow diagram of an operation for data processing in an LDPC decoder, including calculating a fractional unsatisfied check quality metric in accordance with some embodiments of the present inventions.

Turning to FIG. 6, a flow diagram 600 is depicted of an operation for data processing in an LDPC decoder, including calculating a fractional unsatisfied check quality metric in accordance with various embodiments of the present inventions. Following flow diagram 600, the decoding iteration is started (block 602) based on input data to the LDPC decoder or with data derived from input data and subsequently modified during a previous local decoding iteration. V2C messages are generated. (Block 604) V2C messages may be generated, for example, in a variable node processor based on perceived values of data bits or symbols in data being decoded. Parity check calculations are performed for check nodes based on the V2C messages received at each check node. (Block 606) C2V messages are generated. (Block 610) C2V messages may be generated, for example, in a check node processor based on the parity check calculations. Variable node values are updated based on the C2V messages. (Block 612) If the maximum number of local iterations has not been reached (block 616), the next local iteration is performed. Otherwise, a determination is made as to whether the data converged in the LDPC decoder. (Block 620) If the data converged (block 620), decoding is finished and hard decisions may be provided at an output of the LDPC decoder. (Block 622) If the data failed to converge (block 620), one or more error recovery operations may be performed (block 624), such as targeted symbol flipping, in an effort to assist the data to converge on the correct values.

The calculation of a fractional unsatisfied check quality metric may be performed in parallel with one or more of the above-disclosed operations, or in serial fashion. The probability that a parity check will be unsatisfied is calculated for each check node. (Block 630) The unsatisfied check probability distribution is calculated as the probability for each possible number k of unsatisfied checks that the codeword for the data sector has k unsatisfied checks. (Block 632) The fractional unsatisfied check quality metric is calculated based on the unsatisfied check probability distribution. (Block 634)

Figure 7:
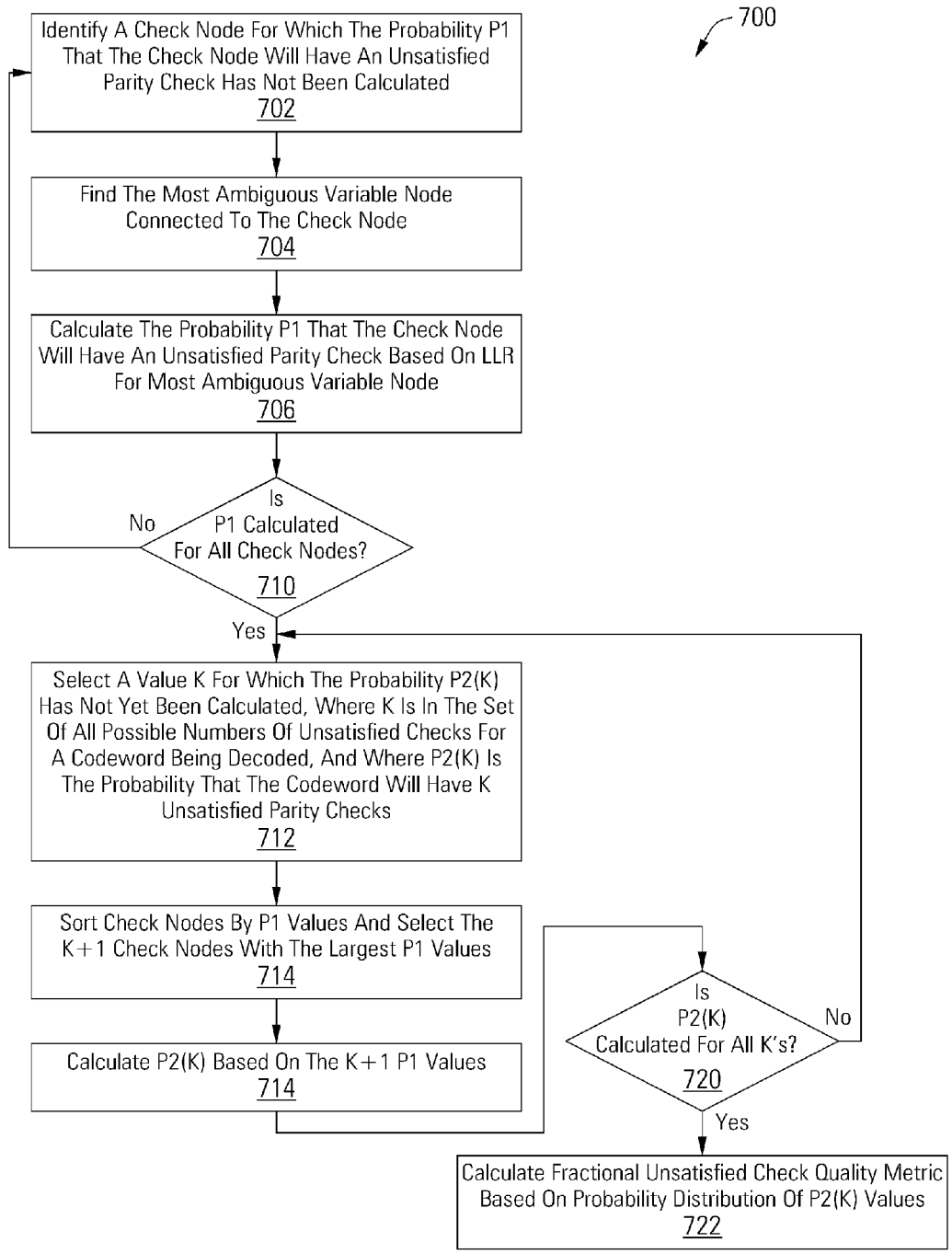
FIG. 7 depicts a flow diagram of an operation for calculating a fractional unsatisfied check quality metric in accordance with some embodiments of the present inventions.

Turning to FIG. 7, a flow diagram 700 is depicted of an operation for calculating a fractional unsatisfied check quality metric in accordance with some embodiments of the present inventions. Following flow diagram 700, a check node is identified for which the probability p1 that the check node will have an unsatisfied parity check has not been calculated. (Block 702) The most ambiguous variable node connected to the check node is identified. (Block 704) The most ambiguous variable node may be defined in some embodiments as argmin_i[min_j(llr_{i,j})], where i is the variable index and j is the LLR index of the non-zero LLR values for the variable node. In other words, the most ambiguous variable node is the one which has the largest non-zero LLR component among all the variable nodes connected to the check node. The probability p1 that the check node will have an unsatisfied parity check is calculated. (Block 706) A determination is made as to whether p1 has been calculated for all check nodes. (Block 710) If not, the next check node is identified and the process of calculating p1 probabilities continues. (Block 702) If p1 has been calculated for all check nodes (block 710), a value k is selected for which the probability p2(k) has not yet been calculated (block 712), where k is the set of all possible numbers of unsatisfied checks for a codeword being decoded, and where p2(k) is the probability that the codeword will have k unsatisfied parity checks. The check nodes are sorted by p1 values and the k+1 check nodes with the largest p1 values are selected. (Block 714) The p2(k) probability is calculated for the current k based on the k+1 p1 values. (Block 716) A determination is made as to whether p2(k) has been calculated for all possible k's. (Block 720) If not, the p2(k) calculation process continues for another k value. (Block 712) If so, the fractional unsatisfied check quality metric is calculated based on the probability distribution of p2(k) values. (Block 722)

Figure 8:
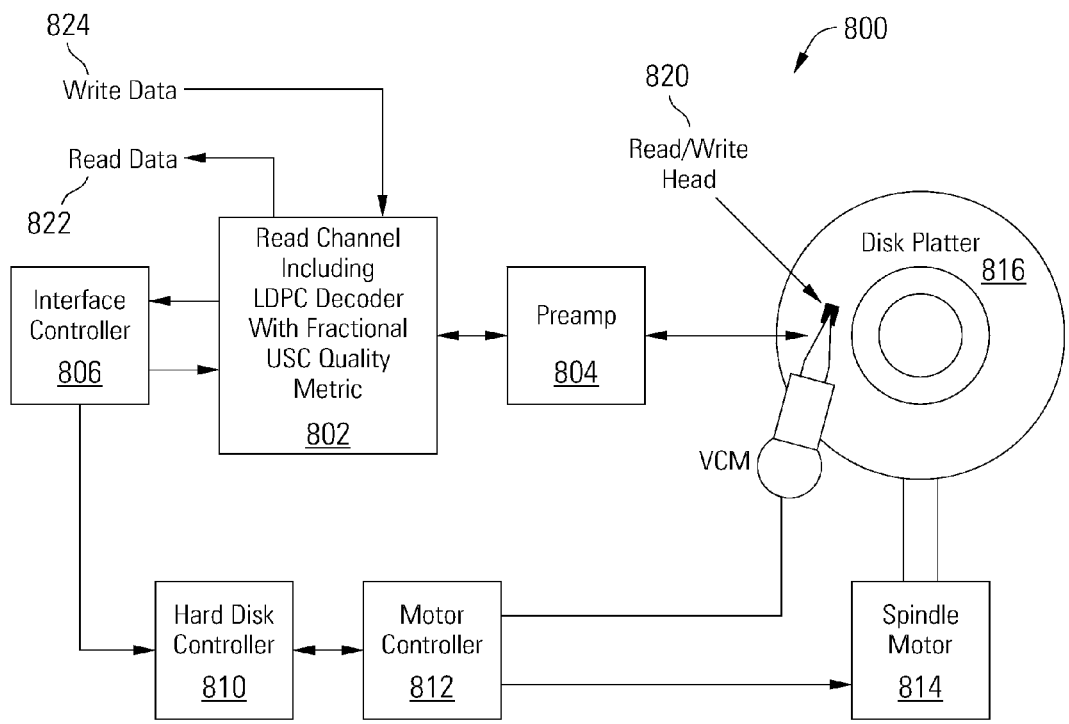
FIG. 8 depicts a storage system including a data processing circuit with an LDPC decoder with a fractional unsatisfied check quality metric in accordance with some embodiments of the present inventions.
Figure 9:
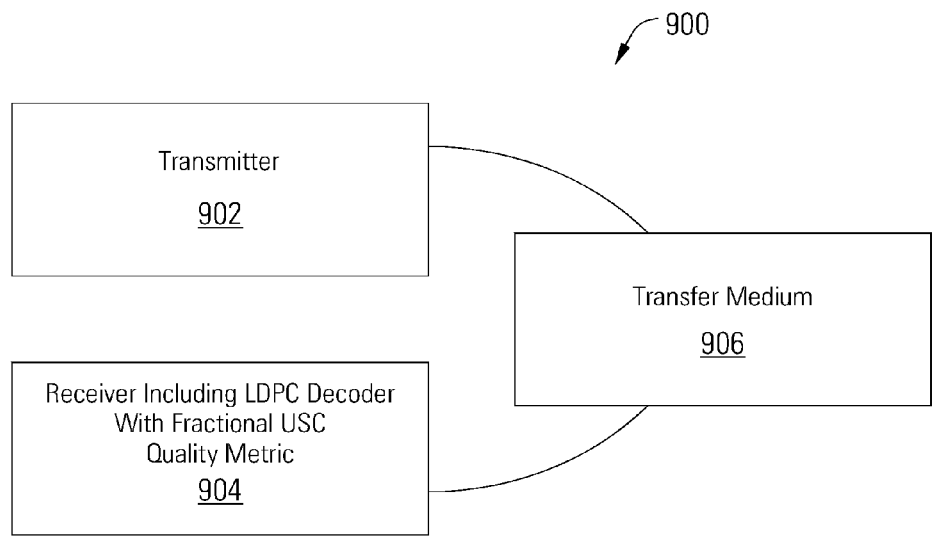
FIG. 9 depicts a wireless communication system including a data processing circuit with an LDPC decoder calculating a fractional unsatisfied check quality metric in accordance with some embodiments of the present inventions.

Although the LDPC decoder with fractional unsatisfied check quality metric disclosed herein is not limited to any particular application, several examples of applications are presented in FIGS. 8 and 9 that benefit from embodiments of the present inventions. Turning to FIG. 8, a storage system 800 including a read channel circuit 802 having an LDPC decoder with fractional unsatisfied check quality metric is shown in accordance with some embodiments of the present inventions. Storage system 800 may be, for example, a hard disk drive. Storage system 800 also includes a preamplifier 804, an interface controller 806, a hard disk controller 810, a motor controller 812, a spindle motor 814, a disk platter 816, and a read/write head 820. Interface controller 806 controls addressing and timing of data to/from disk platter 816. The data on disk platter 816 consists of groups of magnetic signals that may be detected by read/write head assembly 820 when the assembly is properly positioned over disk platter 816. In one embodiment, disk platter 816 includes magnetic signals recorded in accordance with either a longitudinal or a perpendicular recording scheme.

In a typical read operation, read/write head assembly 820 is accurately positioned by motor controller 812 over a desired data track on disk platter 816. Motor controller 812 both positions read/write head assembly 820 in relation to disk platter 816 and drives spindle motor 814 by moving read/write head assembly to the proper data track on disk platter 816 under the direction of hard disk controller 810. Spindle motor 814 spins disk platter 816 at a determined spin rate (RPMs). Once read/write head assembly 820 is positioned adjacent the proper data track, magnetic signals representing data on disk platter 816 are sensed by read/write head assembly 820 as disk platter 816 is rotated by spindle motor 814. The sensed magnetic signals are provided as a continuous, minute analog signal representative of the magnetic data on disk platter 816. This minute analog signal is transferred from read/write head assembly 820 to read channel circuit 802 via preamplifier 804. Preamplifier 804 is operable to amplify the minute analog signals accessed from disk platter 816. In turn, read channel circuit 802 decodes and digitizes the received analog signal to recreate the information originally written to disk platter 816. This data is provided as read data 822 to a receiving circuit. As part of decoding the received information, read channel circuit 802 processes the received signal using an LDPC decoder with trapping set identification. Such an LDPC decoder with fractional unsatisfied check quality metric may be implemented consistent with that disclosed above in relation to FIGS. 2-5. In some cases, the LDPC decoding with fractional unsatisfied check quality measurement may be done consistent with the flow diagrams disclosed above in relation to FIGS. 6 and 7. A write operation is substantially the opposite of the preceding read operation with write data 824 being provided to read channel circuit 802. This data is then encoded and written to disk platter 816. It should be noted that various functions or blocks of storage system 800 may be implemented in either software or firmware, while other functions or blocks are implemented in hardware.

Storage system 800 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 800, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 9, a data transmission system 900 including a receiver 904 having an LDPC decoder with fractional unsatisfied check quality metric is shown in accordance with various embodiments of the present invention. Data transmission system 900 includes a transmitter 902 that is operable to transmit encoded information via a transfer medium 906 as is known in the art. The encoded data is received from transfer medium 906 by a receiver 904. Receiver 904 processes the received input to yield the originally transmitted data. As part of processing the received information, receiver 904 decodes received data with an LDPC decoder with fractional unsatisfied check quality metric. In some cases, receiver 904 may be implemented to include an LDPC decoder with fractional unsatisfied check quality metric similar to that disclosed in relation to FIGS. 2-5. Further, the LDPC decoding with fractional unsatisfied check quality measurement may be accomplished consistent with the approach disclosed in relation to FIGS. 6 and 7.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for an LDPC decoding with fractional unsatisfied check quality measurement. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
a low density parity check decoder operable to iteratively generate messages between a plurality of check nodes and variable nodes, and to calculate a fractional quality metric for a data block as it is decoded in the low density parity check decoder based at least in part on perceived values of data in the variable nodes, wherein the fractional quality metric comprises a probabilistic determination of a number of unsatisfied parity checks in the low density parity check decoder.

2. The apparatus of claim 1, wherein the fractional quality metric is calculated at each decoding iteration in the low density parity check decoder.

3. The apparatus of claim 1, wherein the fractional quality metric is calculated based at least in part on log likelihood ratio values in the variable node to check node messages.

4. The apparatus of claim 1, wherein the low density parity check decoder comprises a fractional quality metric generator operable to calculate the fractional quality metric.

5. The apparatus of claim 4, wherein the fractional quality metric generator is operable to calculate a probability for each of the check nodes that a parity check calculation will be unsatisfied.

6. The apparatus of claim 5, wherein the fractional quality metric generator is operable to calculate the probability for each of the check nodes that a parity check calculation will be unsatisfied by identifying one of the variable nodes connected to the check node having a largest non-zero log likelihood value among all the variable nodes connected to the check node, and calculating the probability for the check node that the parity check calculation will be unsatisfied based on the identified variable node.

7. The apparatus of claim 5, wherein the fractional quality metric generator is operable to calculate a probability distribution based on the probabilities for each of the check nodes that the parity check calculations will be unsatisfied.

8. The apparatus of claim 7, wherein the fractional quality metric generator is operable to calculate the fractional quality metric as a mean value of the probability distribution.

9. The apparatus of claim 7, wherein the fractional quality metric generator is operable to calculate the probability distribution as a second probability for each of a plurality of possible numbers of unsatisfied parity checks in the low density parity check decoder that the data block will have that number of unsatisfied parity checks.

10. The apparatus of claim 9, fractional quality metric generator is operable to calculate the probability distribution in part by sorting the check nodes by the probability and selecting a set of the check nodes with highest probability values, wherein the set contains one more member than a possible number of unsatisfied parity checks for which the probability distribution is currently being calculated.

11. The apparatus of claim 1, wherein the low density parity check decoder comprises a scheduler operable to allocate decoding resources in the low density parity check decoder based at least in part on the fractional quality metric.

12. The apparatus of claim 1, wherein the low density parity check decoder comprises at least one error recovery feature controlled at least in part based on the fractional quality metric.

13. The apparatus of claim 1, wherein the apparatus is implemented as an integrated circuit.

14. The apparatus of claim 1, wherein the apparatus is incorporated in a storage device.

15. The apparatus of claim 14, wherein the storage device comprises a redundant array of independent disks.

16. The apparatus of claim 1, wherein the apparatus is incorporated in a transmission system.

17. A method for calculating a fractional quality metric in a low density parity check decoder, comprising:
    calculating for each of a plurality of check nodes in an H matrix for the low density parity check decoder a first probability that a corresponding one of the plurality of check nodes will be unsatisfied during a decoding iteration;
    calculating for each of a plurality of possible number of unsatisfied parity checks for the plurality of check nodes in the H matrix a second probability that the decoding iteration will result in a corresponding number of unsatisfied parity checks, wherein the plurality of second probabilities form a probability distribution; and
    calculating the fractional quality metric based on the probability distribution.

18. The method of claim 17, wherein calculating the fractional quality metric based on the probability distribution comprises calculating a mean value of the probability distribution.

19. The method of claim 17, wherein calculating the plurality of second probabilities comprises performing a first order approximation to calculate a coefficient of a characteristic polynomial.

20. A storage system comprising:
    a storage medium maintaining a data set;
    a read/write head assembly operable to sense the data set on the storage medium; and
    a data processing circuit operable to correct errors in the data set, wherein the data processing circuit comprises a low density parity check decoder operable to calculate a fractional quality metric for the data set, wherein the fractional quality metric comprises a probabilistic determination of a number of unsatisfied parity checks in the low density parity check decoder.

* * * * *